(12) United States Patent
Roy et al.

(10) Patent No.: US 9,521,751 B2
(45) Date of Patent: Dec. 13, 2016

(54) WEAVED ELECTRICAL COMPONENTS IN A SUBSTRATE PACKAGE CORE

(71) Applicant: Intel Corporation, Santa Clara, CA (US)

(72) Inventors: Mihir K. Roy, Chandler, AZ (US); Mathew J. Manusharow, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 200 days.

(21) Appl. No.: 14/085,613

(22) Filed: Nov. 20, 2013

(65) Prior Publication Data

US 2015/0138743 A1    May 21, 2015

(51) Int. Cl.
| | |
|---|---|
| H01B 7/00 | (2006.01) |
| H01B 3/50 | (2006.01) |
| H05K 1/16 | (2006.01) |
| H01B 7/08 | (2006.01) |
| H01B 3/48 | (2006.01) |
| H01F 17/00 | (2006.01) |
| H05K 1/03 | (2006.01) |

(Continued)

(52) U.S. Cl.
CPC ............. *H05K 1/165* (2013.01); *H01B 3/485* (2013.01); *H01B 3/50* (2013.01); *H01B 7/083* (2013.01); *H01F 17/0006* (2013.01); *H05K 1/038* (2013.01); *H05K 3/103* (2013.01); *H05K 3/4046* (2013.01); *H05K 1/0222* (2013.01); *H05K 3/043* (2013.01); *H05K 3/26* (2013.01); *H05K 2201/029* (2013.01); *H05K 2201/097* (2013.01); *H05K 2201/09809* (2013.01); *H05K 2201/1081* (2013.01); *H05K 2201/10287* (2013.01); *H05K 2203/025* (2013.01); *H05K 2203/0228* (2013.01); *H05K 2203/1461* (2013.01); *H05K 2203/175* (2013.01)

(58) Field of Classification Search
CPC ........... H01B 7/083; H01B 3/48; H01B 3/485; H01B 3/50
USPC ................. 174/121 R, 121 A, 122 R, 124 R, 110 D,174/392, 393; 361/748
See application file for complete search history.

(56) References Cited

U.S. PATENT DOCUMENTS 6,148,500 A * 11/2000 Krone ................. H01F 17/0033
29/602.1
6,599,561 B2    7/2003 Dow et al.
(Continued)

*Primary Examiner* — Binh Tran
(74) *Attorney, Agent, or Firm* — Blakely, Sokoloff, Taylor & Zafman LLP

(57) ABSTRACT

A substrate package includes a woven fabric having electrically non-conductive strands woven between electrically conductive strands including wire strands, co-axial strands, and/or an inductor pattern of strands. The package may be formed by an inexpensive and high throughput process that first weaves the non-conductive strands (e.g., glass) between the conductive strands to form a circuit board pattern of conductive strands in a woven fabric. Next, the woven fabric is impregnated with a resin material to form an impregnated fabric, which is then cured to form a cured fabric. The upper and lower surfaces of the cured fabric are subsequently planarized. Planarizing segments and exposes ends of the wire, co-axial, and inductor pattern strands. Since the conductive strands were formed integrally within the planarized woven fabric, the substrate has a high mechanical stability and provides conductor strand based electrical components built in situ in the substrate package.

21 Claims, 8 Drawing Sheets

(51) Int. Cl.
*H05K 3/10* (2006.01)
*H05K 3/40* (2006.01)
*H01B 3/04* (2006.01)
*H01B 7/02* (2006.01)
*H05K 1/02* (2006.01)
*H05K 3/04* (2006.01)
*H05K 3/26* (2006.01)

(56) References Cited

U.S. PATENT DOCUMENTS

| | | | |
|---|---|---|---|
| 7,236,139 B2 * | 6/2007 | Waschenko | H01Q 1/362 343/790 |
| 2005/0062669 A1 * | 3/2005 | Aisenbrey | H01Q 9/28 343/795 |
| 2006/0124193 A1 * | 6/2006 | Orr | A61B 5/0002 139/421 |
| 2011/0000412 A1 * | 1/2011 | Chung | A41D 1/005 112/78 |

* cited by examiner

US 9,521,751 B2

WEAVED ELECTRICAL COMPONENTS IN A SUBSTRATE PACKAGE CORE

FIELD

Embodiments of the invention are related in general, to semiconductor device packaging and, in particular, to substrate packages and printed circuit board (PCB) substrates upon which an integrated circuit (IC) chip may be attached, and methods for their manufacture.

BACKGROUND

Integrated circuit (IC) chips (e.g., "chips", "dies", "ICs" or "IC chips"), such as microprocessors, coprocessors, and other microelectronic devices often use package devices ("packages") to physically and/or electronically attach the IC chip or die to a circuit board, such as a motherboard (or motherboard interface). The die is typically mounted within a package that, among other functions, enables electrical connections between the die and a socket, a motherboard, or another next-level component.

These packages may be described as or include a substrate core, a substrate package, an electronic device circuit board, a motherboard, or a printed circuit board (PCB) upon which an integrated circuit (IC) chip or die may be attached. These packages may serve as a base for the mechanical support and electrical interconnection of semiconductor devices (e.g., integrated circuits). Such packages may include a sheet-like base formed of an electrically non-conductive composite material (e.g., a glass material with epoxy resin) with a top and bottom surface; and a number of electrically conductive vias, wires and/or plated through holes (PTH) extending from the top to the bottom surface.

These packages may be manufactured by initially forming a sheet-like base of non-conductive material. The sheet-like base can be formed, for example, by weaving glass fibers into a sheet of cloth or fabric. The sheet of cloth is then dipped in resin and thermally cured to form the sheet-like base. Thereafter, via holes are mechanically drilled through the sheet-like base, plated and filled with an electrically conductive material (e.g., copper) to form electrically conductive vias (e.g., plated through holes (PTH)). The mechanical drilling, plating and filling process of some conventional processing are expensive, have a low throughput and result in a low yield. This is especially so when a PCB substrate with a large number of electrically conductive vias and/or electrically conductive vias of small diameter is being manufactured. Furthermore, the act of mechanically drilling through the sheet-like base, by itself, can inadvertently decrease the mechanical stability of the PCB substrate.

Still needed in the field, is an inexpensive and high throughput process for manufacturing such packages. In addition, the process could result in a high package yield and a package of high mechanical stability. Also needed in the field, is a package having better components for providing stable and clean power, ground, and high frequency signals between its top and bottom surfaces, such as to contacts on the surfaces that will be electrically connected to an IC or motherboard.

BRIEF DESCRIPTION OF THE DRAWINGS

The embodiments of the invention are illustrated by way of example and not by way of limitation in the figures of the accompanying drawings in which like references indicate similar elements. It should be noted that references to "an" or "one" embodiment of the invention in this disclosure are not necessarily to the same embodiment, and they mean at least one.

DETAILED DESCRIPTION

Several embodiments of the invention with reference to the appended drawings are now explained. Whenever the shapes, relative positions and other aspects of the parts described in the embodiments are not clearly defined, the scope of embodiments of the invention is not limited only to the parts shown, which are meant merely for the purpose of illustration. Also, while numerous details are set forth, it is understood that some embodiments of the invention may be practiced without these details. In other instances, well-known circuits, structures, and techniques have not been shown in detail so as not to obscure the understanding of this description.

Some embodiments herein describe circuit board devices (and systems) including a circuit board pattern (e.g., a woven cloth or fabric) having electrically non-conductive strands woven between electrically conductive wire strands, co-axial strands, and/or inductor patterned strands, and processes for their manufacture. In some cases, the circuit board is a semiconductor device packaging and, in particular, a substrate packages (or cores) or printed circuit board (PCB) substrates upon which an integrated circuit (IC) chip may be attached. In some embodiments, the strands may be solid wires, co-axial connectors, part of an inductor, and/or plated through holes (PTH) formed through a circuit board. In some cases, the wire strands, co-axial strands, and/or inductor patterned strands are described as weaved electrical components that exist in a substrate package core.

Some embodiments described herein can provide various conductor strand based features built in situ in the substrate package core that can act as electrical components. Such a package can include or provide inductors, co-axial PTH and standard copper filled PTH simultaneously built into the core. These features may be "inbuilt" into the substrate core during manufacturing of the circuit board (e.g., during weaving of the fabric), rather than embedding a discrete component after the resin of the board is cured, or the board is planarized. Building the component features in to the substrate core can eliminate reliability concern as well as substrate real estate concern that exist for prior packages. Some embodiments described herein provide a package architecture, and a process for forming such a package, that are of comparable cost to existing non-embedded substrate cost, and are of costs that are significantly lower than the embedded component based substrate cost.

Figure 1A:
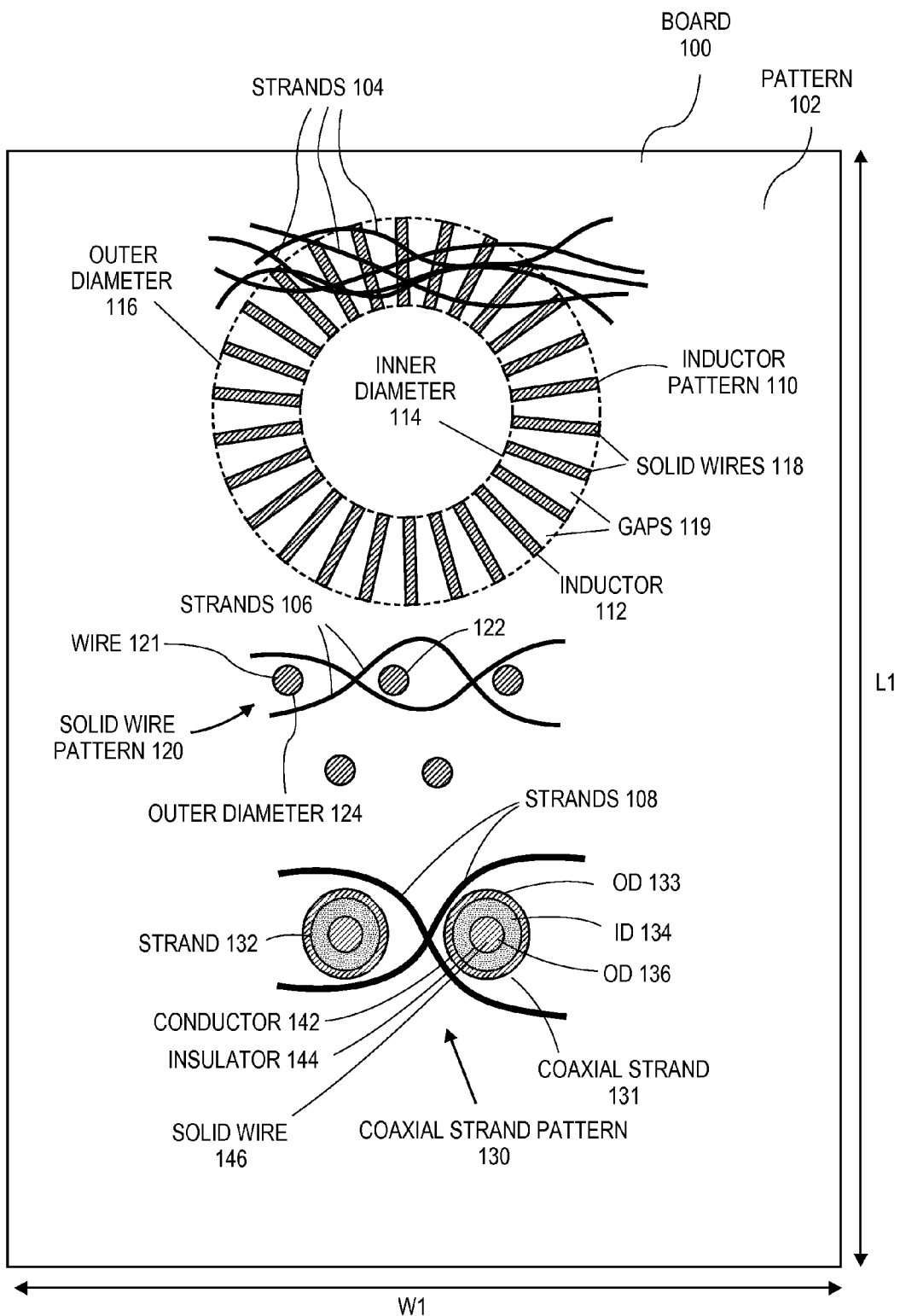
FIG. 1A is a schematic cross-sectional top view of a circuit board having non-conductive strands woven between conductive wire strands, co-axial strands, and inductor patterned strands, according to embodiments described herein.
Figure 1B:
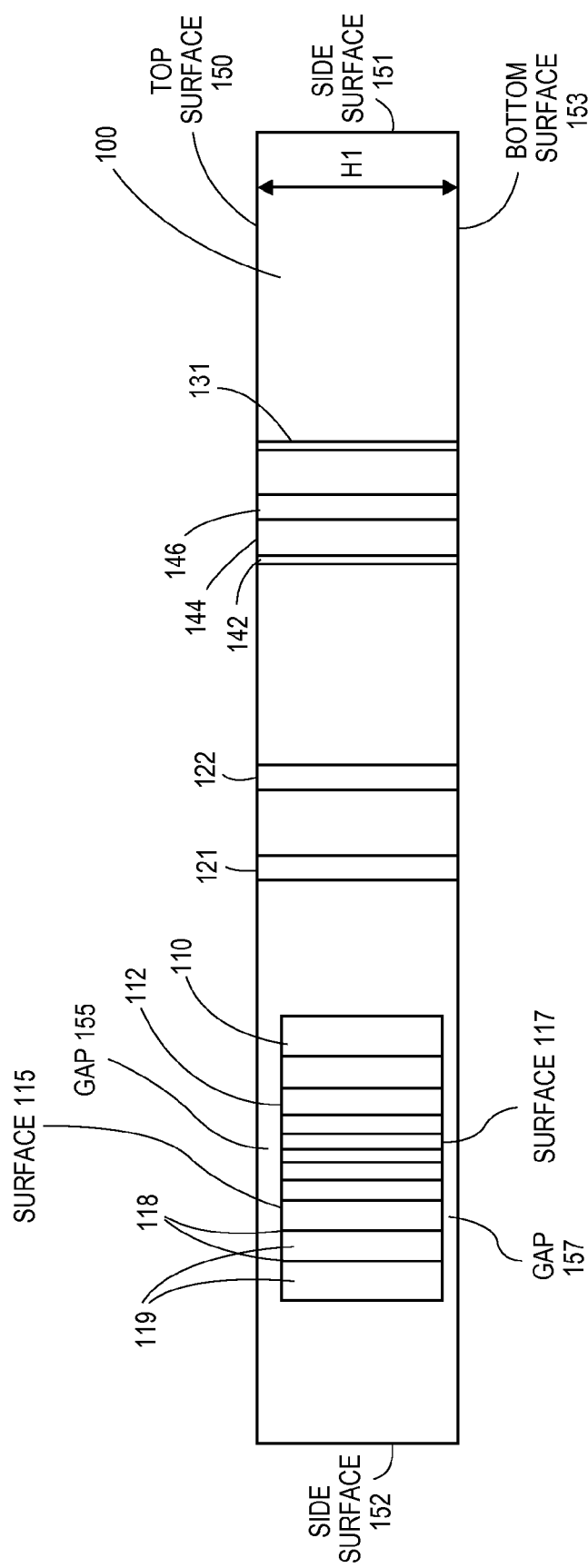
FIG. 1B is a schematic cross-sectional side view of the circuit board of FIG. 1A, according to embodiments described herein.

FIG. 1A is a schematic cross-sectional top view of a circuit board having non-conductive strands woven between conductive wire strands, co-axial strands, and inductor patterned strands, according to embodiments described herein. FIG. 1B is a schematic cross-sectional side view of the circuit board of FIG. 1A, according to embodiments described herein. FIGS. 1A-B show circuit board 100 having circuit board pattern 102 (e.g., a woven cloth or fabric) of non-conductive strands 104, 106 and 108 woven between component patterns including inductor wire strand pattern 110, conductive wire pattern 120, and co-axial wire pattern 130.

Circuit board 100 may be or include a circuit board upon which an integrated circuit chip may be directly mounted. In some cases, the circuit board is a semiconductor device package and, in particular, a substrate package (or core) or printed circuit board (PCB) substrate. In some cases, the circuit board may be or include a substrate core, a substrate package, an electronic device circuit board, a motherboard, or a printed circuit board (PCB) upon which an integrated circuit (IC) chip may be attached.

Circuit board 100 is shown having height H1, Length L1 and width W1. Circuit board 100 may include a footprint or shadow area of the IC chip. The footprint may be larger than and extend over the top cross sectional area of patterns 110, 120 and 130. In some cases, the footprint is less than L1 by W1. In some cases, the footprint covers the top cross sectional area of some of patterns of wire, coaxial and inductor pattern strands of board 100, but does not cover others.

Inductor pattern 110 forms inductor 112. Pattern 110 includes solid wires 118 and gaps 119 between the solid wires. Strands 104 may be woven between wires 118, such as through gaps 119. Such weaving may include weaving wires 118 through strands 104. Such weaving may form a sheet of cloth or fabric that includes strands 104 woven with wires 118. It can be appreciated that various other patterns of weaving can be used, such as those known for weaving non-conductive strands and clothing fibers.

Pattern 110 includes inner diameter 114 and outer diameter 116, top surface 115 and bottom surface 117. Inner diameter 114 may be defined by a circular shape perimeter of the inner portion of pattern 110. Outer diameter 116 may be defined by the outer perimeter shape of pattern 110. Surface 115 may be defined by the top perimeter shape of pattern 110. Surface 117 may be defined by the bottom perimeter shape of pattern 110. Board 100 includes top surface 150, side surfaces 151 and 152 and bottom surface 153. Gap 155 is shown between top surface 150 of the board and top surface 115 of inductor pattern 110. Gap 157 is shown between surface 153 and surface 117.

In some cases, pattern 110 includes an inductor pattern having a Toroid pattern of wires of solid conductor material configured to low pass filter (e.g., pass high frequency but not low frequency signals), de-noise, stabilize or communicate high frequency data signals, graphics signals, Graphics Double Data Rate (GDDR) memory signals, alternating current (AC) signals, video signals, and/or audio signals.

Diameter 116 of the inductor may be between 100 and 250 microns. Larger diameters may have higher induction (which may be bad for high frequencies, but good for direct current).

According to some embodiments, inductor pattern 110 is a pattern of solid conductor material wires 118 woven into or having a Toroid pattern that has an inner circular top cross sectional diameter 114 and an outer circular top cross sectional diameter 116; a top surface 115 between the inner diameter and the outer diameter, and a bottom surface 117 between the inner diameter and the outer diameter. In some cases, the top surface 115 is a side cross sectional flat surface below a planarized top surface 150 of the board (with an optional input or output wire extending to the surface), and bottom surface 117 is a side cross sectional flat surface below a planarized bottom surface 153 of the board (with an optional input or output wire extending to the surface).

It can be appreciated that various other shapes for diameters 114 and 116; surfaces 115 and 117; and pattern 110 can be used. It can be appreciated that surfaces 115 and 117 can have a side cross sectional shape that is flat, concave, convex, or S curved. It can be appreciated that diameters 114 and 116 can have a top cross sectional shape that is square, rectangular, oval or egg-shaped. It can be appreciated that the vertical strands of solid wires 118 shown in FIG. 1B can have a side cross sectional shape that is flat, concave, convex, or S curved.

In some cases, wires 118 include an input wire and an output wire for or to inductor 112. The input and output wires may be wires further woven or used to form wires 121 and 122. The input and output wires may extend to the top surface 150 and/or bottom surface 153 of the board. In some cases, the input wire may be on or extend to the top or bottom surface; and the output wire may be on or extend to the opposite surface. In some cases, the input wire may be on or extend to the top or bottom surface; and the output wire may be on or extend to the same surface. The input and output wires may be segmented during planarization. It can be appreciated that the exposed ends of the input and output wires at or on the surfaces may be connected to electrical interconnects, traces or contacts formed in or on surfaces of board 100.

Pattern 120 includes wires 121 and 122. It can be appreciated that other patterns of wires can be used. Non-conductive strands 106 are shown woven between wires 121 and 122, or pattern 120. Such weaving may include weaving wires 121 and 122 through strands 106. Such weaving may form a sheet of cloth or fabric that includes strands 106 woven with wires 121 and 122.

In some cases, pattern 120 includes a solid wire pattern of conductive strands of solid conductor material that are configured to pass, send or communicate power signals, direct current (DC) signals, bias signals, and/or ground signals. Wire 121 is shown having outer diameter 124. Wire diameter 124 may be between 5 and 20 microns. Some cases may require larger diameter, such as between 10 and 20 microns, for higher power density.

It can be appreciated that wires 121 and 122 may have a circular, square, rectangular, oval or other top cross sectional shape. In some cases, wire 121 may represent a wire; a co-axial connector or wire; a wire part of an inductor patter; or a plated through hole (PTH) formed through a circuit board. It can be appreciated that various other patterns of weaving can be used, such as those known for weaving non-conductive strands and clothing fibers.

Wire pattern 130 includes coaxial strand 131 and 132. Non-conductive strands 108 are shown woven between strands 131 and 132. Such weaving may include weaving strands 131 and 132 through strands 108. Such weaving may form a sheet of cloth or fabric that includes strands 108 woven with strands 131 and 132. It can be appreciated that various other patterns of weaving can be used, such as those known for weaving non-conductive strands and clothing fibers.

Strand 131 is shown having solid conductor material wire 146, having outer diameter 136 surrounded by or encased in dielectric or insulator 144, surrounded by or encased in conductor 142. Conductor 142 may be considered an outer shield cylinder of conductor material surrounding the core of wire 146. Conductor 142 is shown having outer diameter 133 and inner diameter 134. Insulator 144 is shown formed in between diameters 136 and 134.

In some cases, pattern 130 includes a co-axial pattern of conductive strands of co-axial conductor materials configured to pass, send or communicate high frequency data signals, graphics signals, Graphics Double Data Rate (GDDR) memory signals, alternating current (AC) signals, video signals, and/or audio signals.

The outer diameter 133 of the coaxial strand may be between 50 and 70 microns. Diameter 136 may be less than or equal to 50 microns. Diameter 134 may add between 15 and 20 microns per side around diameter 136. Diameter 133 may add between 10 and 20 microns of conductive material, per side, around diameter 136. In some cases, diameter 133 may be between 100 and 250 microns. Larger diameters may have higher induction (which may be bad for high frequencies, but good for direct current).

It can be appreciated that other top cross sectional shapes for wire 146, insulator 144, and conductor 142 can be used. For example, they can have a square, rectangular, oval, egg-shaped, cross sectional shape.

Some embodiments of board 100 provide an in build toroid shaped inductor pattern 110 into the substrate core (e.g., board 100). Inductor pattern 110 may be an in build along with other substrate features such as plated through hole (PTH) with filled copper (e.g., wires 121 and 122), co-axial PTH with optimized dielectric in between the electrodes (e.g., strands 131 and 132).

Some embodiments of pattern 110 provide an approach to integrate an inductor structure into the substrate core. This may be achieved by weaving the glass fibers and copper wires simultaneously followed by impregnating resin with filler in the weave. This resin impregnation can be done by several techniques such as pressure molding the advanced materials needed (if any) to the selected area of the weaved fabric and then dipping the weave into the core resin (typically epoxy based materials with silica fillers). Once the core is cured the panels can be ground on front and back side surface and, then the planar surface of the substrate can be copper plated for interconnect, trace and contact features.

In some embodiments, a key to achieving various technology features in the substrate core lies in what type of conductors are getting woven with glass fibers. Weaving technology use may be very similar to the weaving of the garments where multiple fiber strands are used. Weaving technology is old, but recent changes to the technology allows the weaving multiple strands of fibers (glass fiber and a conductor wire such as copper) into the pattern of choice. The conductor wire(s) can be woven in (e.g., include conductive strands woven in) the z direction of the substrate and the glass fibers can be woven in (e.g., include non-conductive strands woven in) the x-y direction of the substrate (please refer to FIGS. 1-3). The glass fibers in addition to providing the mechanical strength to the substrate can hold the conductors wires in place during the resin impregnation process. The weaving of various patterns can lead to the electrical components in the core, making substrate core more electrical feature rich (as briefly described for FIG. 1). Also, multiple types of electrical conductors can be weaved simultaneously, such as combinations of (i) solid copper wires can act as the filled vertical interconnect can replace the typical plated through hole (PTH) of the substrate (e.g., pattern 120), (ii) co-axial wires with pre-coated copper and dielectric on the solid central wire for very high speed signals (e.g., pattern 130), and (iii) weaving solid copper wires in to the shape of the toroid shape to make it an inductor (e.g., pattern 110). One proposed process flow to enable this innovation is shown in FIG. 4.

In some cases, board 100 includes a pattern or weave including a non-conductive board pattern of non-conductive strands (e.g. strands 104, 106 and 108) horizontally woven between a component pattern of conductive strands (e.g. pattern 110, 120, and 130). In some cases such a circuit board weave is (e.g., only includes) or includes non-conductive strands 104 and 106 woven between pattern 110 and 120. In some cases it is (e.g., only includes) or includes strands 104 and 108 between pattern 110 and 130. In some cases it is (e.g., only includes) or includes strands 106 and 108 woven between pattern 120 and 130. In some case it is (e.g., only includes) or includes only strands 104 woven between pattern 110. In some cases it is (e.g., only includes) or includes only strands 108 woven between pattern 130.

Resin may be impregnated or laminated within or through the circuit board pattern of non-conductive or conductive strands. The resin may be cured to form a solid circuit board, as board 100. Impregnating and curing may be done as known in the art. Top surface 150 and bottom surface 153 may be planar surfaces in some cases, surfaces 150 and 153 are planarized such as by chemical, mechanical, or other planarizing techniques as known in the art. Such planarizing may segment conductive strands of pattern 120 and 130 such that the wires and coaxial strands extend from surface 150 to 153, but do not reenter board 100. However, such planarizing may leave intact wires 118, except for an input and output to conductor pattern 110. Additional descriptions of impregnating, curing and planarizing are provided below.

Thus, board 100 may be described as a planarized cure composite material with an upper planed surface 150, a lower planed surface 153, and electrically conducted strand segments of pattern 120 and 130 extending from the upper to the lower surface. Board 100 may also include wires 118 within the board, but not extending to the upper and lower surface (except, optionally, the input and output wires extending to the surfaces). It can be appreciated that the exposed ends of conductive strands of pattern 110 (e.g., optionally, the input and output wires), 120 and 130 at or on surfaces 150 and 153 may be connected to electrical interconnects, traces or contacts formed in or on surfaces of board 100. In some cases, the electrical interconnects, traces or contacts are formed in or on surfaces of board 100 at the locations of the exposed ends of conductive strands of patterns 110, 120 and 130.

Figure 2A:
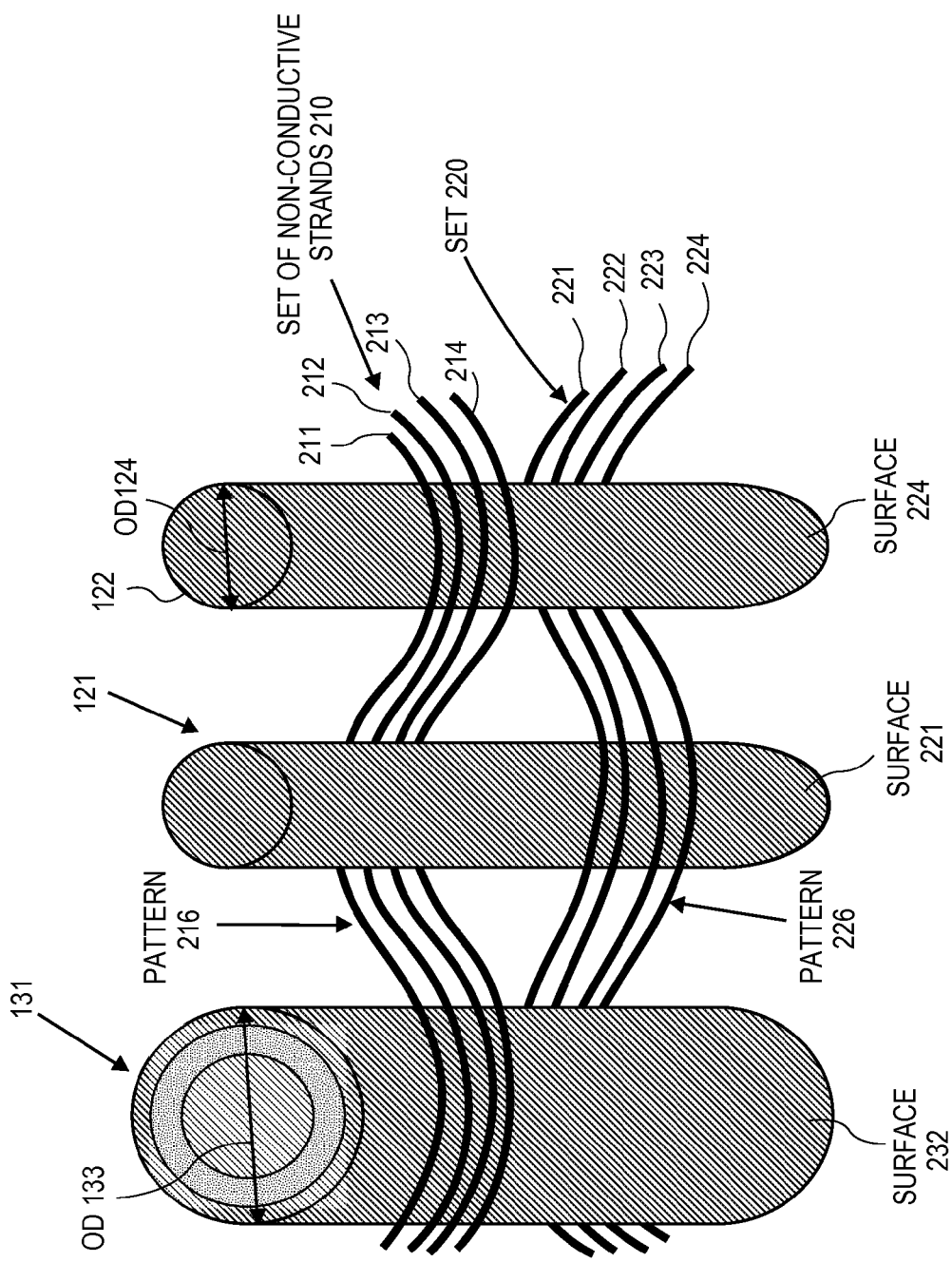
FIG. 2A shows conductive strands of FIGS. 1A and 1B having sets of non-conductive strands woven between them.

FIG. 2A shows conductive strands of FIGS. 1A and 1B having sets of non-conductive strands woven between them. Coaxial strand 131 is shown having outer diameter 133 and outer surface 232. Wire 122 is shown having outer diameter 124 and surface 224 between strand 131 and wire 122. Wire 121 is shown having surface 221. Set of non-conductive strands 210 are shown woven horizontally between strands 131, 121 and 124 in pattern 216. Set of non-conductive strands 220 are shown woven between conductive strands 131, 121 and 124 in pattern 226. It can be appreciated that patterns 216 and 226 are mirror images with respect to the longitudinal axes of strands 131, 121 and 134. It can be appreciated that various other patterns of weaving can be used, such as those known for weaving non-conductive strands and clothing fibers.

Set of strands 210 includes strand 211, 212, 213 and 214. Set 220 includes strands 221, 222, 223 and 224. Although four strands are shown in each set, it can be appreciated that various other numbers of strands can be used. Although strands 210 and 220 are shown with pattern 216 and 226, it can be appreciated that other patterns can be used. Set of strands 210 and 220 may represent strands 106 or 108. In some cases they represent both strands 106 and 108. In some cases strands 210 and 220 represent a weaving pattern for strands 104.

Figure 2B:
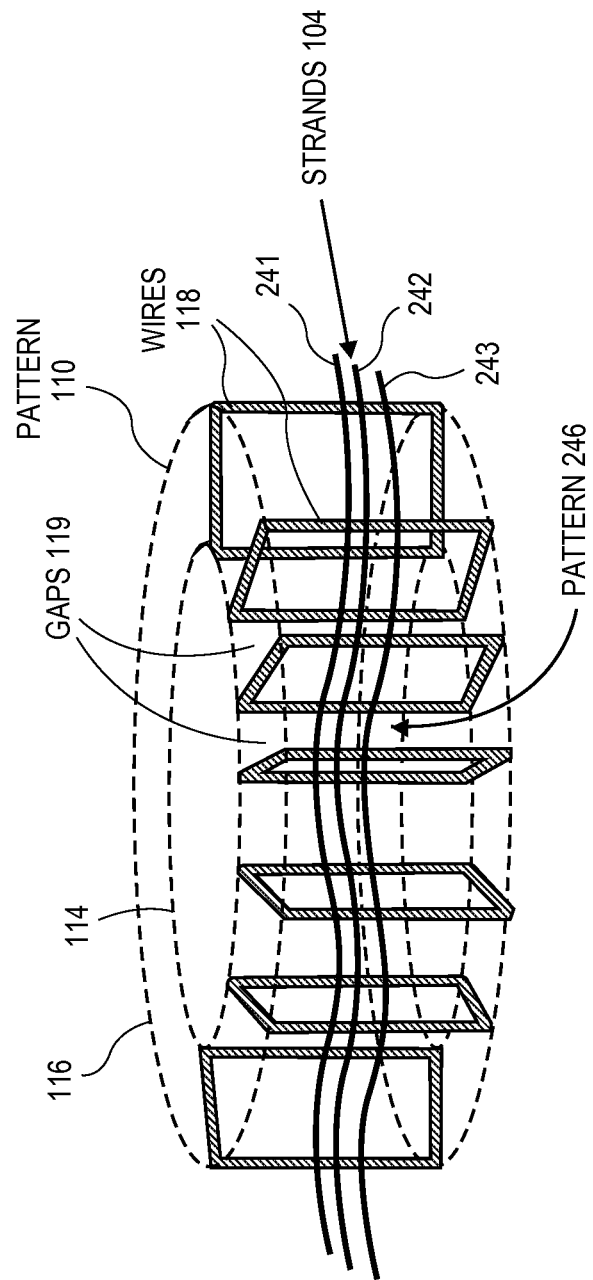
FIG. 2B shows an inductive pattern of wires of FIGS. 1A and 1B, having sets of non-conductive strands woven between them.

FIG. 2B shows an inductive pattern of wires of FIGS. 1A and 1B, having sets of non-conductive strands woven between them. FIG. 2B shows inductive pattern 110 of solid wires 118 of FIGS. 1A and 1B, having sets of non-conductive strands woven between them. FIG. 2A shows wires 118 having strands 104 woven between them. Strands 104 include non-conductive strands 241, 242 and 243. Strands 104 are shown woven between wires 118 and pattern 246. Strands 104 may be considered woven through gaps 119 between wires 118. It can be appreciated that various other patterns of weaving can used, such as those known for weaving non-conductive strands and clothing fibers.

In some cases, FIGS. 2A and 2B, show a schematic depiction of multiple types of conductors (e.g., conductive strands) in a pair of glass fiber strands (e.g., non-conductive strands). The glass fiber strands may have dual functions, such as to (1) provide mechanical integrity to the substrate core as a function of the glass fibers, and (2) provide support to vertical conductors to keep them position fixed (e.g., x,y; or x,y,z) during the resin filling process which may be a critical part of substrate core manufacturing. In some cases, the glass fiber strands to provide reinforcement and to keep conductors in fixed position during resin filling.

In some cases the non-conductive board pattern includes at least horizontally woven or disposed strands between, throughout, within, around, or woven with the conductive strands. In some cases the circuit board weave includes the non-conductive strands woven in an X,Y direction between the conductive strands to form the circuit board pattern, and wearing the conductive strands in a Z direction, such that it leaves some of the conductive strands extend from a top surface to a bottom surface of the circuit board pattern. In some cases the non-conductive strands are glass fibers. In some cases the conductive strands are wire and/or coaxial strands.

In some cases, the non-conductive strands include a first set of vertically adjacent parallel non-conductive strands (e.g., set 210) woven or disposed horizontally between the conductive strands in a first pattern (e.g., pattern 120, 130 and/or 110); and a second set of vertically adjacent parallel non-conductive strands (e.g., set 220) woven horizontally between the conductive strands in a second pattern that is a horizontal mirror image of the first pattern with respect to a vertical or Z direction. The two sets may be described as having in opposing patterns with respect to the conductive strands.

Some embodiments described herein provide a substrate package that can replace prior substrate cores with a core that has more active features in it, including a mix of inbuilt inductors, co-axial vertical interconnects, and filled through holes (e.g., wires). All these features may increase value the substrate core adds to the overall substrate package and may eliminate some surface mount passives (e.g., shorts caused by prior PTH designs or manufacturing). One benefit of the embodiments described herein is that they may not require any modification of the existing lines at substrate manufacturers. The embodiments (e.g., board 100, pattern 102; fabric 300, 500 or 501) can be implemented at or by a core manufacturer, and the finished cores can be sent to a substrate manufacturer for interconnect and top layer (contact and trace) patterning and making of the subsequent build-up layers.

Figure 3A:
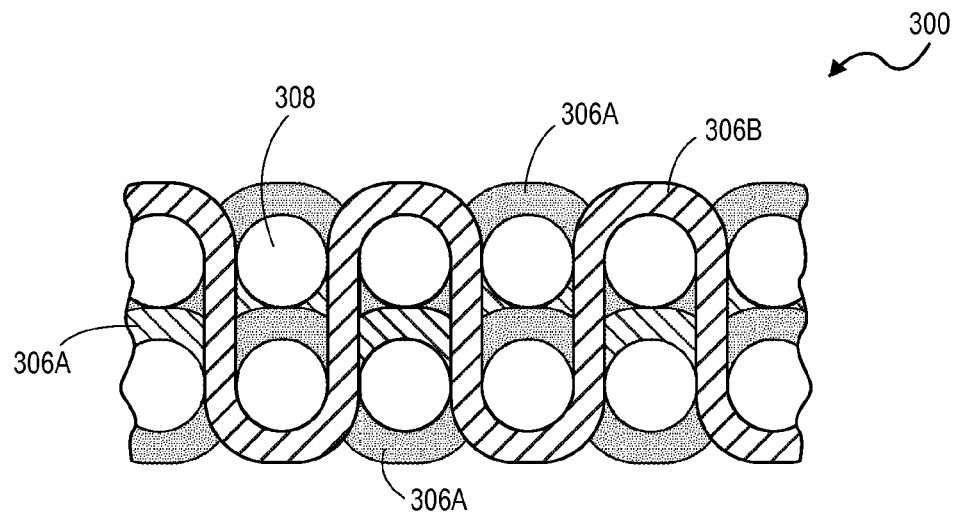
FIGS. 3A and 3B are simplified top and side view representations, respectively, of a two-layer woven fabric produced by a weaving process, according to embodiments described herein.
Figure 3B:
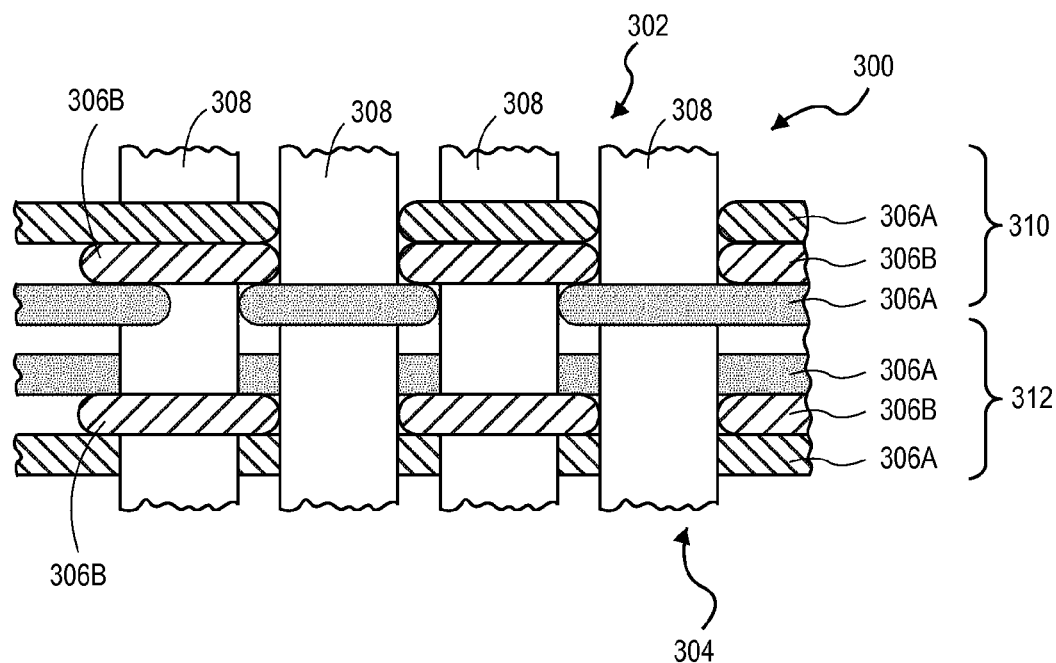
Figure 4:
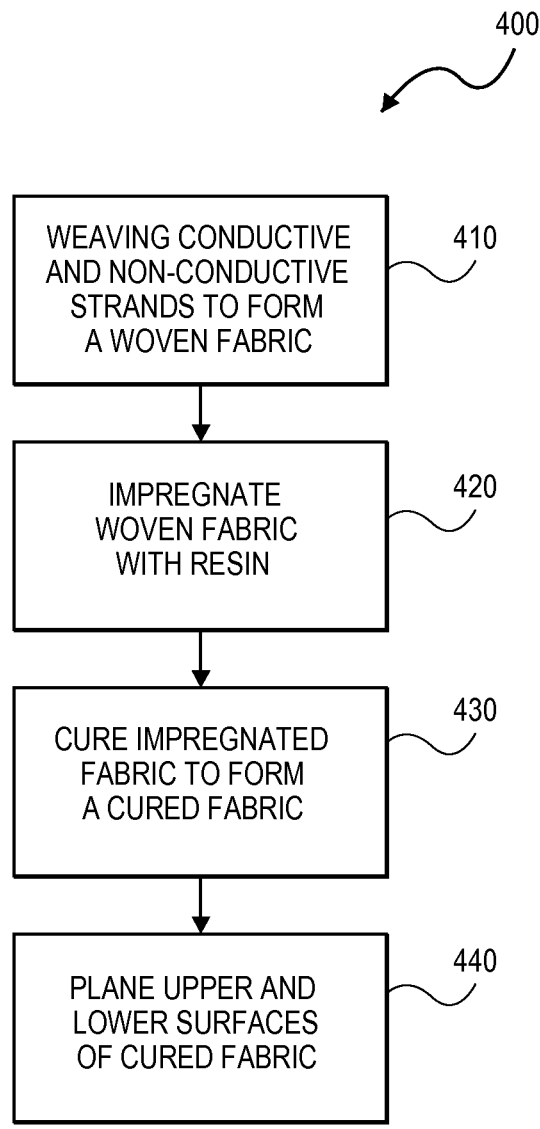
FIG. 4 is a flow chart illustrating a process, according to embodiments described herein.

FIGS. 3A and 3B are simplified top and side view representations, respectively, of a two-layer woven fabric produced by a weaving process of a process, according to embodiments described herein. FIGS. 3A and 3B are simplified representations of an exemplary woven fabric 300, with an upper surface 302 and lower surface 304 formed by weaving a plurality of electrically non-conductive strands (shown as 306a and 306b) and electrically conductive strands 308 (e.g., in accordance with block 410 of FIG. 4). In some cases, fabric 300 is the fabric used to form circuit board 100 and has circuit board pattern 102 of non-conductive strands 104, 106 and 108 woven between component patterns including inductor wire strand pattern 110, conductive wire pattern 120, and co-axial wire pattern 130. In some cases, strands 306a and 306b may represent any one or more of strands 104, 106, and 108. In some cases, strands 308 may represent any one or more of wires 118, wires of pattern 120, coaxial strands of pattern 130.

In some embodiments of FIGS. 3A and 3B, the electrically conductive strands include conductive wire strands 121 and co-axial strands 131 that are woven such that they extend from upper surface 302 of woven fabric 300 to the lower surface 304 of woven fabric 300. In addition, the weaving of these electrically conductive strands 308 may result in "loops" (i.e., "U" shaped segments) of electrically conductive strands 308 at the upper and lower surfaces of woven fabric 300 (not shown).

In some embodiments of FIGS. 3A and 3B, the electrically conductive strands include inductor patterned strands 118 that are woven such that they do not extend to upper surface 302 of woven fabric 300, or to the lower surface 304 of woven fabric 300. In addition, the weaving of these electrically conductive strand 308 may result in "loops" (i.e., flat shaped segments such as surface 115 and 117) of electrically conductive strand 308 below the upper and lower surfaces of woven fabric 300.

In the embodiment of FIGS. 3A and 3B, woven fabric 300 is a double-layer woven fabric that includes top layer 310 and bottom layer 312. Top layer 310 and bottom layer 312 may be essentially woven together by electrically conductive strand 308, which passes back and forth between top layer 310 and bottom layer 312.

In some cases, the plurality of electrically non-conductive strands includes "fill" strands 306a disposed in the off-machine direction and warp strands 306b disposed in the machine direction. The fill strands and warp strands are characterized as "crimped" since they are bent at the points where they cross one another.

In some cases, if desired, the plurality of electrically non-conductive strands can also include "uncrimped" strands (not shown in the embodiment of FIGS. 3A and 3B)

disposed in the machine direction between top layer 310 and bottom layer 312 and/or uncrimped fill strands. Uncrimped strands disposed in the machine direction can provide mechanical reinforcement for the woven fabric and final PCB substrate.

By employing multiple layers (e.g., top layer 310 and bottom layer 312), electrically conductive strands 308 are forced into a vertical position as they pass from the top layer to the bottom layer. As will be evident from the discussion below, such a vertical position results, after planarizing, in an electrically conductive strand segment(s) that is also positioned vertically. Such a vertically positioned electrically conductive strand segment is, therefore, configured to function as a vertically positioned electrically conductive via.

Although FIGS. 3A and 3B illustrate a weave that results in a woven fabric with a woven pattern that follows a square grid array, processes according to the present embodiments of the invention can employ any suitable weaving technique known to one skilled in the art and can result in a woven fabric with regular or irregular woven pattern. For example, a Jacquard weaving technique can be employed to form a woven fabric with regular or irregular woven patterns or a multi-layer woven fabric can be formed in the weaving process. In addition, the diameter and/or type of each of the electrically non-conductive strands and electrically conductive strands can be equal and constant throughout the woven fabric or can vary.

In the embodiment of FIG. 3, the plurality of electrically conductive strand segments are disposed in the planarized woven fabric in a regular pattern. However, the plurality of electrically conductive strand segments can also be disposed in an irregular pattern.

Strands 306A and 306B shown in layer 310 and layer 312 may represent any of strands 104, 106, and 108. For example, the pattern shown in FIGS. 3A and 3B may be used in place of the pattern shown in FIG. 2A or 2B. It can be appreciated that other patterns may be used, such as patterns known for weaving non-conductive strands or clothing fibers.

FIG. 4 is a flow chart illustrating process 400 for manufacturing a package substrate in accordance with an exemplary embodiment of the present invention. Process 400 may be a process for forming a circuit board, a PCB, a substrate package, or a substrate core. Process 400 first includes, at block 410, weaving a plurality of electrically non-conductive strands and at least one electrically conductive strand (e.g., a wire strand, co-axial strand, and/or inductor patterned strand) to form a woven fabric. Block 410 may include laying out or locating the conductive strands at predetermined locations to form the wires, coax strands, and inductor pattern wires. Such layout may include designing or preselecting the location and weave pattern for the conductors. Block 410 may also include weaving a mesh pattern of the non-conductive strands and conductive strands to form a cloth of one or more non-conductive strands woven between any two conductive strands.

Figure 5A:
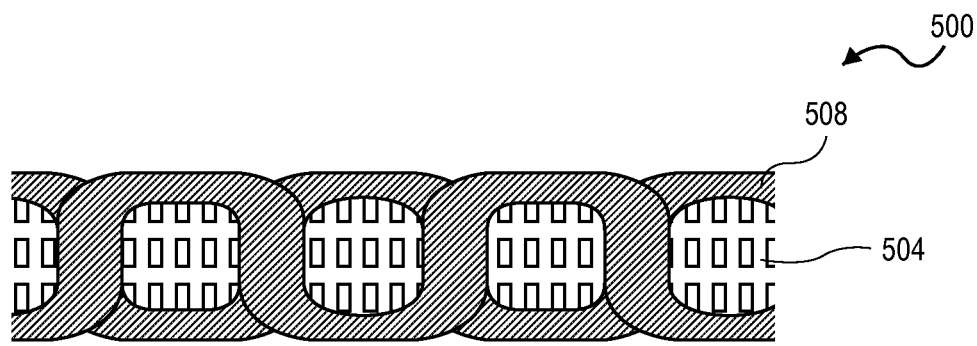
FIG. 5A shows a fabric for a circuit board having electrically non-conductive strands woven between or with electrically conductive strands, prior to resin impregnation, according to embodiments described herein.

FIG. 5A shows a fabric for a circuit board having electrically non-conductive strands woven between or with electrically conductive strands, prior to resin impregnation, according to embodiments described herein. Board 500 is shown having non-conductive strands 504 woven with conductive strands 508. Board 500 may represent board 100 or 300. Strands 504 may represent any or all of strands 104, 106, and 108. Conductive strands 508 may represent any of wires 118; wires 121 and 122; and/or strands 131 and 132.

Block 410 may include weaving wires 118 including an input wire and an output wire for inductor 112 that extend to or beyond the top surface 150 and/or bottom surface 153 of the board. These input and output wires may be segmented during planarization at block 440.

The resultant woven fabric may have its upper and lower surfaces exposed. Weaving block 410 can form the woven fabric using any suitable weaving technique including, for example, a single layer or a multi-layer based weaving technique, Dobby or a Jacquard-based weaving technique. The use of a Jacquard-based weaving technique enables the formation of woven fabrics wherein the electrically non-conductive strands and electrically conductive strand(s) are selectively arranged in either of an irregular woven pattern or a regular woven pattern. Weaving block 410 can be conducted using conventional weaving equipment known to one skilled in the art.

The electrically non-conductive strands employed in processes according to embodiments of the present invention can be any suitable electrically non-conductive strands including fibers, filaments or yarns formed of glass (e.g., fiberglass, S-glass or E-glass), polyester or other polymers, Teflon or Kevlar. Exemplary commercial electrically non-conductive strands include Type 1064 Multi-End Roving and Hybon 2022 Roving available from PPG Industries.

If a glass strand is employed, it can be optionally treated with silane to improve its adhesive properties to the impregnating resin. One skilled in the art will recognize that the electrical characteristics of the electrically non-conductive strand are a factor in determining the dielectric constant of the PCB substrate.

The thickness of the electrically nonconductive strand is dependent on the weaving technique employed and the thickness of the packaging substrate being manufactured. A typical thickness, where E-glass-based electrically non-conductive fiber are employed, is in the range of 1 microns to 20 microns.

The electrically conductive strand(s) employed in block 410 can be any suitable conductive strand including, but not limited to wire strands 121 and 122; co-axial strands 131 and 132; and inductor patterned strands 118. These strands may include a conductor or material such as a copper wire, gold wire, aluminum wire, an electrically conductive polymer wire or a combination thereof. The diameter of the strands depends on the thickness of the substrate being manufactured and the desired density of electrically conductive vias disposed therein. A typical diameter, however, is in the range of 15 microns to 200 microns.

The electrically conductive strands can either (i) replace a strand that would normally be included in a conventional woven fabric (e.g., a strand that is normally used in a plain weave) or (ii) be implemented as an additional strand beyond those normally included in the pattern of the woven fabric.

The thickness of the woven fabric formed in block 410 may be predetermined based on the required substrate thickness. A typical thickness of the woven fabric is, however, in the range of 0.5 mm to 10 mm. In some cases, the thickness is a thickness typically used to produce a circuit boards or package substrates.

Block 410 may include forming a circuit board pattern or fabric (e.g., a weave) including a non-conductive board pattern of non-conductive strands (e.g., glass fibers) at least horizontally woven between (e.g., throughout, within, around or with) a component pattern of conductive strands (e.g., wires and co-axial strands).

Next, at block 420, the woven fabric may be impregnated with a resin material to form an impregnated fabric. Block 420 may include dipping the circuit board pattern, fabric, or cloth in and epoxy resin, and then squeezing or applying pressure to both sides of the cloth. Squeezing the cloth may help ensure that the resin is infused into all the spaces between the conductive and non-conductive strands, and to ensure that any air or gas is eliminated from between the strands.

Figure 5B:
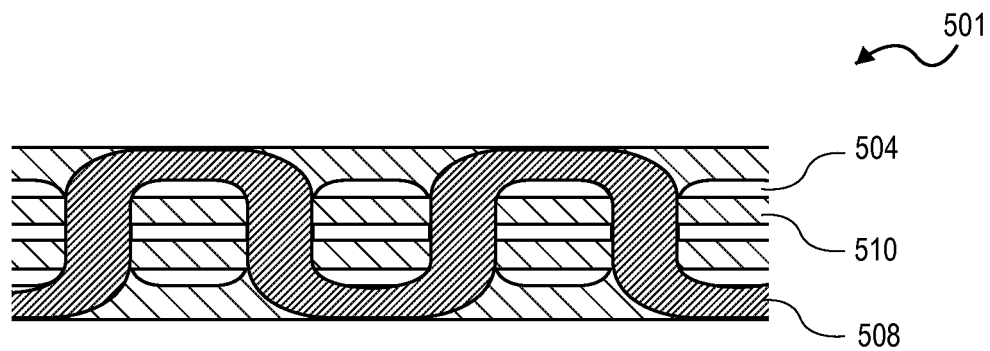
FIG. 5B shows the fabric of FIG. 5A after resin impregnation, according to embodiments described herein.

FIG. 5B shows the fabric of FIG. 5A after resin impregnation, according to embodiments described herein. Fabric 501 is shown having non-conductive strands 504 and conductive strands 508 impregnated with resin 510. Thus, fabric 501 may be board 500 having pattern 102 or a fabric of conductive and non-conductive strands woven together, after impregnating the fabric with resin.

The resin material can be any suitable resin material known to one skilled in the art including, for example, epoxy-based resins, bis-mali-imide based resins, Per-Fluoroalkane resins and polyimide resins. Impregnation of the woven fabric with the resin material can be accomplished using conventional techniques. The term "impregnating" refers to the act of filling throughout, saturating or permeating an object (e.g., a woven fabric).

Block 420 may include impregnating or laminating a circuit board pattern (e.g., fabric 500 or pattern 102) with resin. This may form an impregnated circuit board pattern (e.g., having resin infused within, through, or throughout the circuit board pattern).

Next, at block 430 the impregnated fabric may be cured to form a cured fabric. Block 430 may include curing in an oven at between 170 and 180 degree Celsius. Block 430 may include providing the substrate with a "hand" that is a preselected or predetermined hand.

The curing can be accomplished, for example, using conventional thermal and/or ultraviolet curing techniques. Although curing process parameters are dependent on the resin material used to impregnate the woven fabric, curing block 430 is typically conducted in a nitrogen or air ambient, at a temperature in the range of 125 degrees Celsius to 200 degrees Celsius, and for a time period in the range of 15 minutes to 2 hours.

Block 430 may include curing the resin to form a cured circuit board pattern (e.g., cured fabric 501 or pattern 102). Block 430 may include curing the impregnated circuit board pattern (e.g., cured fabric 501 or pattern 102) to form a cured composite material (e.g., board 100 or pattern 102).

At block 440, after curing of the impregnated fabric, the upper and lower surfaces of the cured fabric may be planed or planarized. Block 440 may include planarizing a top surface and a bottom surface of the cured circuit board pattern to form circuit board 100 having components (e.g., wired, co-axial strands, and inductors) in circuit board pattern 102. Block 440 may include planarizing the surfaces to segment at least one wire or co-axial strand woven over top and bottom surface of the circuit board pattern. Block 440 may include segmenting wires 118 that are an input wire and an output wire for inductor 112 that extend to or beyond the top surface 150 and/or bottom surface 153 of the board. Block 440 may include forming a planarized cured composite material board 100 with an upper planed surface 150, a lower planed surface 153 and a plurality of electrically conductive strand segments (e.g., wire or co-axial strands) extending from the upper planed surface to the lower planed surface.

Figure 5C:
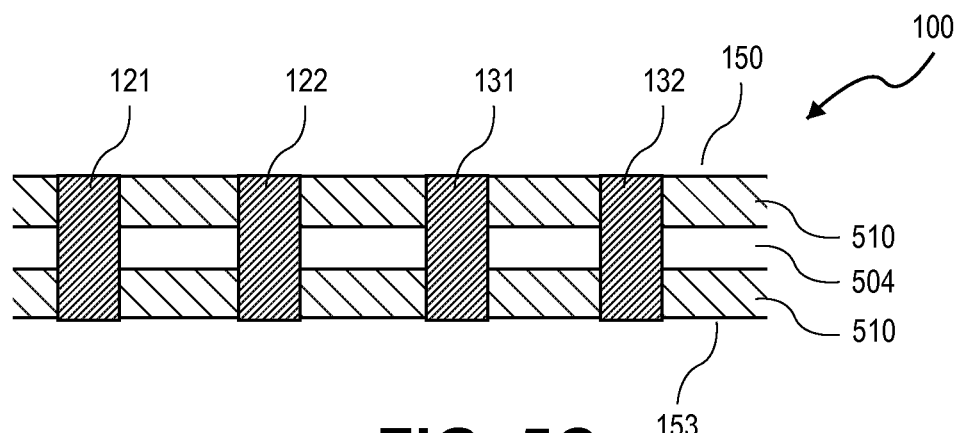
FIG. 5C shows the fabric of FIG. 5B after curing the resin and mechanical planarization of the top and bottom surface, according to embodiments described herein.

FIG. 5C shows the fabric of FIG. 5B after curing the resin and mechanical planarization of the top and bottom surface, according to embodiments described herein. FIG. 5C shows board 100 having top surface 150 and bottom surface 153, which may be formed by curing the resin impregnated into fabric 501; then planarizing the top and bottom surface of board 501. Wires 121 and 122, and coaxial strands 131 and 132 are shown extending from the top to bottom surface. It can be appreciated that board 100 may also include wires 118 of inductor pattern 110, such as shown in FIGS. 1A and 1B. FIG. 5C also shows non-conductive strands 504 and cured resin 510.

The term "planing" or "planarizing" may refer to removing the surface(s) of an object (e.g., a cured fabric). This planing block may serve to segment the at least one conductive strand and form a substrate 100 that includes a planarized cured fabric or pattern 102 with an upper planed surface 150, a lower planed surface 153 and a plurality of conductive strand segments (e.g., wire strands, co-axial strands, and/or inductor patterned strands) created from the at least one conductive strand. Some of the conductive strand segments (e.g., wire strands and/or co-axial strands) extend from the upper planed surface to the lower planed surface and may serve as electrically conductive vias of the substrate. In other words, the planing process removes each of the "reentrant loops" of these electrically conductive strands at the upper and lower surfaces of the woven fabric, leaving a plurality of electrically conductive strand segments (vias). Some of the conductive strand segments (e.g., inductor patterned strands) do not extend to the upper planed surface or to the lower planed surface and may serve as electrically conductive wires of an inductor formed within the height or thickness of the substrate, after planarizing the cured fabric. In some cases, there are input and output wires to the inductor patterned strands that do extend to the upper and or lower planed surfaces. In some cases, these input and output wires do not extend to those surfaces but are connected to other conductive strands (e.g., of pattern 120 or 130) between the board surfaces.

The planarizing can be accomplished using grinding techniques, lapping techniques and/or milling techniques (often referred to as "scalping") known to one skilled in the art. The planing process can remove, for example, 1.0 mm to 0.5 mm from each of the upper and lower surfaces of the cured fabric. Exemplary but non-limiting dimensions for substrate 100 are a thickness of 0.8 mm, an electrically conductive strand segment pitch of 1.0 mm and an electrically conductive strand segment diameter of 70 microns for wires 121, 122 and 118.

It can be appreciated that after planarizing, the exposed ends of conductive strands of patterns 110, 120 and 130 at or on surfaces 150 and 153 may be connected to electrical interconnects, traces or contacts formed in or on surfaces of board 100. In some cases, the electrical interconnects, traces or contacts are formed in or on surfaces of board 100 at the locations of the exposed ends of conductive strands of patterns 110, 120 and 130.

Forming inductive pattern 110 within board 100 provides advantages including filtering signals between the top and surface of the board so that discreet capacitors are not required on the dye side of the board, or on the motherboard below the packaging substrate; and providing more stable power signaling between the top and bottom surface of the board. In addition, forming wires 121 and 122 provides stable and good power signal transfer (e.g., direct current or ground) between the top and bottom surface of the board. In addition, forming coaxial strands 131 and 132 provide more stable and better high frequency signal transfer between the top and bottom surfaces of the board. Such signals may have a frequency of greater than or equal to one gigabyte per second. Such signals may include high frequency video, graphics, audio, GDDR, memory, and other high frequency signals. Other advantages include the non-conductive fibers holding the weaved pattern (e.g., pattern 102) of the conductive fibers in place, at desired locations during resin impregnation and curing. Other advantages include forming patterns 110, 120 and 130 with conductive strands extending to the surfaces of board 100 without drilling, plating, or via forming into surfaces 150 and 153 of the board. In addition, forming wires 121 and 122; the coaxial strands 131 and 132; or the input output wires to pattern 110 may: (1) avoid sharp edges at the surfaces of the board, that are formed when plated through holes are drilled and plated with conductor; and (2) avoid forming cavities and filling the cavities, which can lead to cracks in the board due to moisture during manufacture and during use.

Figure 6:
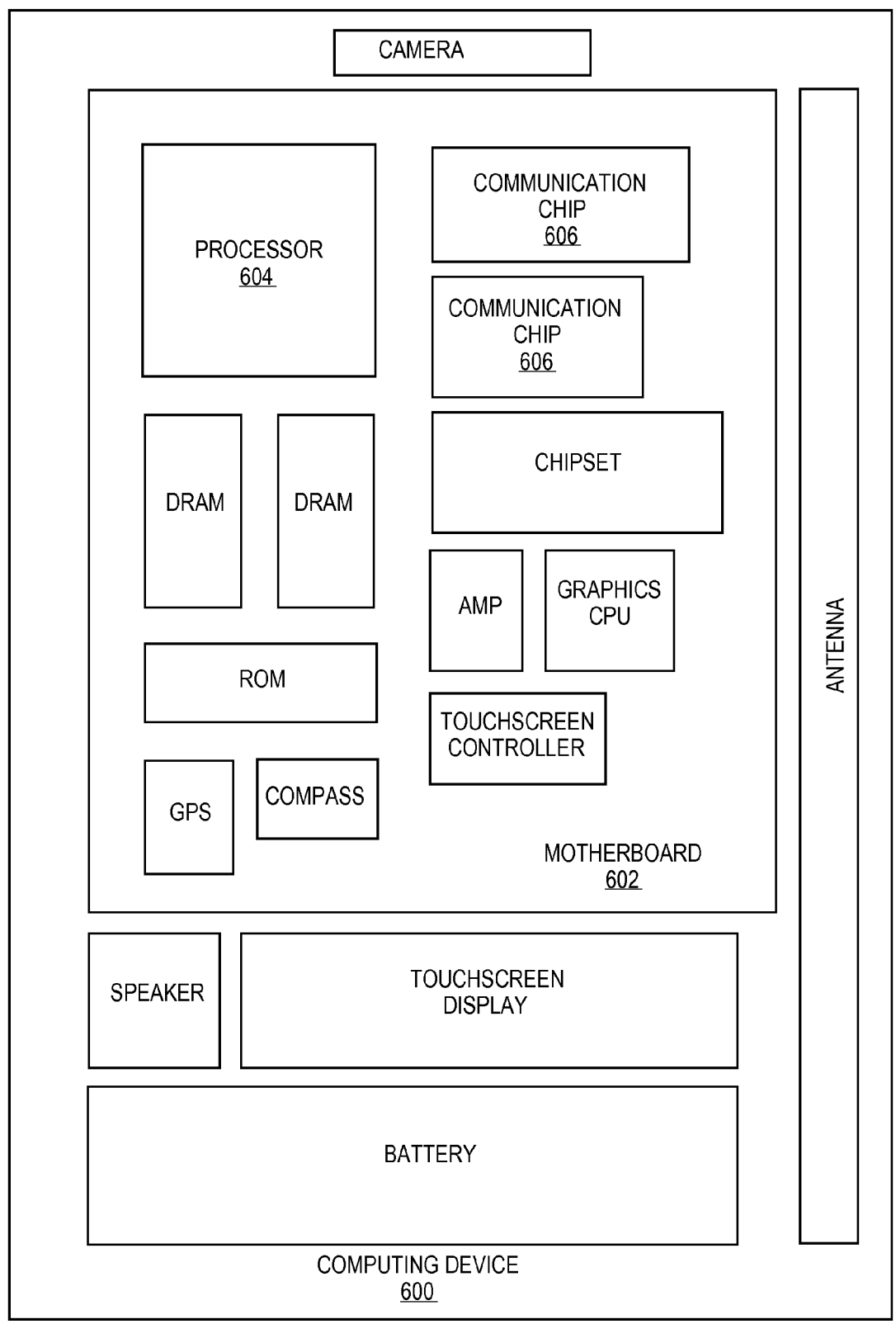
FIG. 6 illustrates a computing device in accordance with one implementation.

FIG. 6 illustrates a computing device in accordance with one implementation. The computing device 600 houses board 602. Board 602 may include a number of components, including but not limited to processor 604 and at least one communication chip 606. Processor 604 is physically and electrically connected to board 602. In some implementations at least one communication chip 606 is also physically and electrically connected to board 602. In further implementations, communication chip 606 is part of processor 604.

Depending on its applications, computing device 600 may include other components that may or may not be physically and electrically connected to board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 606 enables wireless communications for the transfer of data to and from computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including but not limited to Wi-Fi (IEEE 802.6 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

Processor 604 of computing device 600 includes an integrated circuit die packaged within processor 604. In some implementations, the integrated circuit die is mounted on and electrically connected to a substrate package having wire strands, co-axial strands, and/or inductor patterned strands as described with reference to FIGS. 1-5. The package may include or be board 100. It may be formed of or include fabric 300, fabric 500 or fabric 501. The term "processor" may refer to any device or portion of a device that processes electronic data from registers and/or memory to transform that electronic data into other electronic data that may be stored in registers and/or memory.

Communication chip 606 also includes an integrated circuit die packaged within communication chip 606. In accordance with another implementation, a package including a communication chip mounted on and electrically connected to a substrate package having wire strands, co-axial strands, and/or inductor patterned strands as described with reference to FIGS. 1-5.

In further implementations, another component housed within computing device 600 may contain a microelectronic package including an integrated circuit die mounted on and electrically connected to a substrate package having wire strands, co-axial strands, and/or inductor patterned strands as described with reference to FIGS. 1-5.

In various implementations, computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 600 may be any other electronic device that processes data.

EXAMPLES

The following examples pertain to embodiments.

Example 1 is a method of forming a circuit board comprising: forming a circuit board pattern including a non-conductive board pattern of non-conductive strands woven between a component pattern of conductive strands; wherein the component pattern includes one of (a) co-axial strands having a dielectric material between a solid conductor material wire and an outer shield cylinder of conductor material surrounding the solid conductor material wire or (b) an inductor pattern of solid conductor material wires.

In Example 2, the subject matter of Example 1 can optionally include impregnating the circuit board pattern with resin to form an impregnated circuit board pattern; curing the impregnated circuit board pattern to form a cured circuit board pattern; and planarizing a top surface and a bottom surface of the cured circuit board pattern to form a circuit board.

In Example 3, the subject matter of Example 2 can optionally include wherein planarizing includes: segmenting at least one of (a) a co-axial strand, or (b) a solid conductor material wire of the inductor pattern; and forming a planarized cured composite material with an upper planed surface, a lower planed surface and a plurality of electrically conductive strand segments extending from the upper planed surface to the lower planed surface.

In Example 4, the subject matter of Example 1 can optionally include wherein forming includes weaving the non-conductive strands in an X,Y direction between the conductive strands to form the circuit board pattern, and weaving the conductive strands in a Z direction such that at least some of the conductive strands extend from a top surface to a bottom surface of the circuit board pattern and are woven over the top and the bottom surface of the circuit board pattern.

In Example 5, the subject matter of Example 1 can optionally include wherein the non-conductive strands comprise a first set of vertically adjacent parallel non-conductive strands woven horizontally between the conductive strands in a first pattern, and a second set of vertically adjacent parallel non-conductive strands woven horizontally between the conductive strands in a second pattern that is a horizontal mirror image of the first pattern with respect to a vertical direction.

In Example 6, the subject matter of Example 1 can optionally include wherein the conductive strands include wire strands of solid conductor material wires.

In Example 7, the subject matter of Example 1 can optionally include wherein the inductor pattern includes a Toroid pattern formed by a solid conductor material wire; wherein the Toroid pattern has a Toroid inner diameter, a Toroid outer diameter, a Toroid top surface between the inner diameter and the outer diameter, and a Toroid bottom surface between the inner diameter and the outer diameter.

In Example 8, the subject matter of Example 7 can optionally include wherein the Toroid top surface is below a planarized top surface of the board, and the Toroid bottom surface is below a planarized bottom surface of the board.

In Example 9, the subject matter of Example 1 can optionally include wherein the inductor pattern includes an input wire extending to a first surface of the board, and an output wire extending to a second surface of the board; and wherein planarizing includes segmenting the input and output wires.

Example 10 is a circuit board comprising: a circuit board pattern including a non-conductive board pattern of non-conductive strands woven between a component pattern of conductive strands; wherein the component pattern includes one of (a) co-axial strands having a dielectric material between a solid conductor material wire and an outer shield cylinder of conductor material surrounding the solid conductor material wire or (b) an inductor pattern of solid conductor material wires; cured resin impregnated within the circuit board pattern; a top planar surface of the circuit board pattern; and a bottom planar surface of the circuit board pattern.

In Example 11, the subject matter of Example 10 can optionally include wherein the circuit board pattern includes the non-conductive strands woven in an X,Y direction between the conductive strands, and the conductive strands woven in a Z direction such that at least some of the conductive strands extend from a top surface to a bottom surface of the circuit board pattern.

In Example 12, the subject matter of Example 10 can optionally include wherein the non-conductive strands comprise a first set of vertically adjacent parallel non-conductive strands woven horizontally between the conductive strands in a first pattern, and a second set of vertically adjacent parallel non-conductive strands woven horizontally between the conductive strands in a second pattern that is a horizontal mirror image of the first pattern with respect to a vertical direction.

In Example 13, the subject matter of Example 10 can optionally include wherein the conductive strands include wire strands of solid conductor material wires.

In Example 14, the subject matter of Example 10 can optionally include wherein the inductor pattern includes a Toroid pattern formed by a solid conductor material wire; wherein the Toroid pattern has a Toroid inner diameter, a Toroid outer diameter, a Toroid top surface between the inner diameter and the outer diameter, and a Toroid bottom surface between the inner diameter and the outer diameter; and wherein the Toroid top surface is below a planarized top surface of the board, and the Toroid bottom surface is below a planarized bottom surface of the board.

In Example 15, the subject matter of Example 10 can optionally include wherein the inductor pattern includes an input wire extending to a first surface of the board, and an output wire extending to a second surface of the board.

In Example 16, the subject matter of Example 10 can optionally include wherein the circuit board pattern includes: a solid wire pattern of conductive strands of solid conductor material configured to pass power signals or ground signals; a co-axial pattern of conductive strands of co-axial conductor materials configured to pass high frequency data signals; and an inductor pattern having a Toroid pattern of wires of solid conductor material configured to filter out low frequency signals.

Example 17 is a system for computing comprising: an integrated chip mounted on a substrate package, the a substrate package including: a circuit board pattern including a non-conductive board pattern of non-conductive strands woven between a component pattern of conductive strands; wherein the component pattern includes one of (a) co-axial strands having a dielectric material between a solid conductor material wire and an outer shield cylinder of conductor material surrounding the solid conductor material wire or (b) an inductor pattern of solid conductor material wires; cured resin impregnated within the circuit board pattern; a top planar surface of the circuit board pattern; and a bottom planar surface of the circuit board pattern.

In Example 18, the subject matter of Example 17 can optionally include wherein the circuit board pattern includes the non-conductive strands woven in an X,Y direction between the conductive strands, and the conductive strands woven in a Z direction such that at least some of the conductive strands extend from a top surface to a bottom surface of the circuit board pattern.

In Example 19, the subject matter of Example 17 can optionally include wherein the non-conductive strands comprise a first set of vertically adjacent parallel non-conductive strands woven horizontally between the conductive strands in a first pattern, and a second set of vertically adjacent parallel non-conductive strands woven horizontally between the conductive strands in a second pattern that is a horizontal mirror image of the first pattern with respect to a vertical direction.

In Example 20, the subject matter of Example 17 can optionally include wherein the conductive strands include wire strands of solid conductor material wires.

In Example 21, the subject matter of Example 17 can optionally include wherein the inductor pattern includes a Toroid pattern formed by a solid conductor material wire; wherein the Toroid pattern has a Toroid inner diameter, a Toroid outer diameter, a Toroid top surface between the inner diameter and the outer diameter, and a Toroid bottom surface between the inner diameter and the outer diameter; and wherein the Toroid top surface is below a planarized top surface of the board, and the Toroid bottom surface is below a planarized bottom surface of the board.

In Example 22, the subject matter of Example 17 can optionally include wherein the inductor pattern includes an input wire extending to a first surface of the board, and an output wire extending to a second surface of the board.

In Example 23, the subject matter of Example 17 can optionally include wherein the circuit board pattern includes: a solid wire pattern of conductive strands of solid conductor material configured to pass power signals or ground signals; a co-axial pattern of conductive strands of co-axial conductor materials configured to pass high frequency data signals; and an inductor pattern having a Toroid pattern of wires of solid conductor material configured to filter out low frequency signals.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit embodiments of the invention but to illustrate it. The scope of the embodiments of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the embodiments. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an embodiment that requires more features than are expressly recited in each claim. Rather, as the following claims reflect, inventive aspects of embodiments that may lie in less than all features of a single disclosed embodiment. For example, although the descriptions and figures above refer to a substrate package (or core) or a process for forming such a substrate package, the descriptions and figures above can be applied to other circuit boards, such as a motherboard; or circuit board that is larger or smaller than a substrate package. Thus, the claims following the Detailed Description are hereby expressly incorporated into this Detailed Description, with each claim standing on its own as a separate embodiment of the invention.

What is claimed is:

1. A circuit board comprising:
    a circuit board pattern including a non-conductive board pattern of non-conductive strands woven between a component pattern of conductive strands; wherein the component pattern includes both of (a) co-axial strands having a dielectric material between a solid conductor material wire and an outer shield cylinder of conductor material surrounding the solid conductor material wire and (b) an inductor pattern of solid conductor material wires;
    cured resin impregnated within the circuit board pattern;
    a top planar surface of the circuit board pattern;
    a bottom planar surface of the circuit board pattern;
    a first plurality of contacts formed on the top planar surface and coupled to the solid conductor material wire and to the outer shield cylinder of conductor material of the co-axial strands; and
    a second plurality of contacts formed on the top planar surface and electrically coupled to the solid conductor material wires of the inductor pattern.

2. The circuit board of claim 1, wherein the circuit board pattern includes the non-conductive strands woven in an X,Y direction between the conductive strands, and the conductive strands woven in a Z direction such that at least some of the conductive strands extend from a top surface to a bottom surface of the circuit board pattern.

3. The circuit board of claim 1, wherein the non-conductive strands comprise a first set of vertically adjacent parallel non-conductive strands woven horizontally between the conductive strands in a first pattern, and a second set of vertically adjacent parallel non-conductive strands woven horizontally between the conductive strands in a second pattern that is a horizontal mirror image of the first pattern with respect to a vertical direction.

4. The circuit board of claim 1, wherein the conductive strands include wire strands of solid conductor material wires.

5. The circuit board of claim 1, wherein the inductor pattern includes a Toroid pattern formed by a solid conductor material wire; wherein the Toroid pattern has a Toroid inner diameter, a Toroid outer diameter, a Toroid top surface between the inner diameter and the outer diameter, and a Toroid bottom surface between the inner diameter and the outer diameter; and wherein the Toroid top surface is below a planarized top surface of the board, and the Toroid bottom surface is below a planarized bottom surface of the board.

6. The circuit board of claim 1, wherein the inductor pattern includes an input wire extending to a first surface of the board, and an output wire extending to a second surface of the board.

7. The circuit board of claim 1, wherein the circuit board pattern includes:
    a solid wire pattern of conductive strands of solid conductor material configured to pass power signals or ground signals;
    a co-axial pattern of conductive strands of co-axial conductor materials configured to pass high frequency data signals; and
    an inductor pattern having a Toroid pattern of wires of solid conductor material configured to filter out low frequency signals.

8. The circuit board of claim 1, wherein the non-conductive strands are woven between the outer shield cylinder of conductor material and the inductor pattern of solid conductor material wires.

9. The circuit board of claim 8, further comprising interconnects and traces formed in the circuit board pattern, wherein the interconnects and traces connect (1) the first plurality of the contacts to the co-axial strands and (2) the second plurality of the contacts to the inductor pattern.

10. A system for computing comprising:
    an integrated chip mounted on a substrate package, the a substrate package including:
        a circuit board pattern including a non-conductive board pattern of non-conductive strands woven between a component pattern of conductive strands; wherein the component pattern includes both of (a) co-axial strands having a dielectric material between a solid conductor material wire and an outer shield cylinder of conductor material surrounding the solid conductor material wire and (b) an inductor pattern of solid conductor material wires;
        cured resin impregnated within the circuit board pattern;
        a top planar surface of the circuit board pattern;
        a bottom planar surface of the circuit board pattern;

a first plurality of contacts formed on the top planar surface and coupled to the solid conductor material wire and to the outer shield cylinder of conductor material of the co-axial strands; and a second plurality of contacts formed on the top planar surface and electrically coupled to the solid conductor material wires of the inductor pattern.

11. The system of claim 10, wherein the circuit board pattern includes the non-conductive strands woven in an X,Y direction between the conductive strands, and the conductive strands woven in a Z direction such that at least some of the conductive strands extend from a top surface to a bottom surface of the circuit board pattern.

12. The system of claim 10, wherein the non-conductive strands comprise a first set of vertically adjacent parallel non-conductive strands woven horizontally between the conductive strands in a first pattern, and a second set of vertically adjacent parallel non-conductive strands woven horizontally between the conductive strands in a second pattern that is a horizontal mirror image of the first pattern with respect to a vertical direction.

13. The system of claim 10, wherein the conductive strands include wire strands of solid conductor material wires.

14. The system of claim 10, wherein the inductor pattern includes a Toroid pattern formed by a solid conductor material wire; wherein the Toroid pattern has a Toroid inner diameter, a Toroid outer diameter, a Toroid top surface between the inner diameter and the outer diameter, and a Toroid bottom surface between the inner diameter and the outer diameter; and wherein the Toroid top surface is below a planarized top surface of the board, and the Toroid bottom surface is below a planarized bottom surface of the board.

15. The system of claim 10, wherein the inductor pattern includes an input wire extending to a first surface of the board, and an output wire extending to a second surface of the board.

16. The system of claim 10, wherein the circuit board pattern includes:

a solid wire pattern of conductive strands of solid conductor material configured to pass power signals or ground signals;

a co-axial pattern of conductive strands of co-axial conductor materials configured to pass high frequency data signals; and an inductor pattern having a Toroid pattern of wires of solid conductor material configured to filter out low frequency signals.

17. The system of claim 10 wherein the non-conductive strands are woven between the outer shield cylinder of conductor material and the inductor pattern of solid conductor material wires.

18. The system of claim 17, further comprising interconnects and traces formed in the circuit board pattern, wherein the interconnects and traces connect (1) the first plurality of the contacts to the co-axial strands and (2) the second plurality of the contacts to the inductor pattern.

19. A circuit board comprising:

a circuit board pattern including a non-conductive board pattern of non-conductive strands woven between a component pattern of conductive strands; wherein the component pattern includes one of (a) co-axial strands having a dielectric material between a solid conductor material wire and an outer shield cylinder of conductor material surrounding the solid conductor material wire or (b) an inductor pattern of solid conductor material wires;

cured resin impregnated within the circuit board pattern;

a top planar surface of the circuit board pattern;

a bottom planar surface of the circuit board pattern;

a first plurality of contacts formed on the top planar surface and coupled to the solid conductor material wire and to the outer shield cylinder of conductor material of the co-axial strands; and a second plurality of contacts formed on the top planar surface and electrically coupled to the solid conductor material wires of the inductor pattern.

20. The circuit board of claim 19, wherein the non-conductive strands are woven between the outer shield cylinder of conductor material and the inductor pattern of solid conductor material wires.

21. The circuit board of claim 20, further comprising interconnects and traces formed in the circuit board pattern, wherein the interconnects and traces connect (1) the first plurality of the contacts to the co-axial strands and (2) the second plurality of the contacts to the inductor pattern.

* * * * *